(12) United States Patent
Ngo et al.

(10) Patent No.: US 7,202,705 B2
(45) Date of Patent: Apr. 10, 2007

(54) DYNAMIC LOGIC CIRCUIT APPARATUS AND METHOD FOR REDUCING LEAKAGE POWER CONSUMPTION VIA SEPARATE CLOCK AND OUTPUT STAGE CONTROL

(75) Inventors: Hung Cai Ngo, Austin, TX (US); Jente Benedict Kuang, Austin, TX (US); Harmander Singh Deogun, Lincoln, NE (US); AJ Kleinosowski, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 10/992,488

(22) Filed: Nov. 18, 2004

(65) Prior Publication Data

US 2006/0082389 A1    Apr. 20, 2006

(51) Int. Cl.
*H03K 19/096* (2006.01)
(52) U.S. Cl. .......................................... 326/98; 326/95
(58) Field of Classification Search .................. 326/98, 326/95
See application file for complete search history.

(56) References Cited

U.S. PATENT DOCUMENTS

| | | | | |
|---|---|---|---|---|
| 5,796,282 A | * | 8/1998 | Sprague et al. | 327/210 |
| 5,828,234 A | * | 10/1998 | Sprague | 326/98 |
| 6,069,512 A | * | 5/2000 | Rodriguez et al. | 327/200 |
| 6,288,572 B1 | | 9/2001 | Nowka | |
| 6,292,027 B1 | | 9/2001 | Dhong et al. | |
| 6,429,689 B1 | * | 8/2002 | Allen et al. | 326/95 |
| 6,459,316 B1 | * | 10/2002 | Vangal et al. | 327/202 |
| 6,570,408 B2 | * | 5/2003 | Nowka | 326/95 |
| 6,646,487 B2 | * | 11/2003 | Nedovic et al. | 327/211 |
| 6,690,204 B1 | * | 2/2004 | Belluomini et al. | 326/95 |
| 6,888,377 B2 | | 5/2005 | Ngo et al. | |
| 6,900,666 B2 | * | 5/2005 | Kursun et al. | 326/95 |
| 2003/0189445 A1 | * | 10/2003 | Ngo et al. | 326/98 |

OTHER PUBLICATIONS

U.S. Appl. No. 10/965,106, filed Oct. 14, 2004, Deogun, et al.
Mutoh, et al., 1-V Power Supply High-Speed Digital Circuit Technology with Multithreshold-Voltage CMOS, IEEE JSSC Issue V 30, # 8, 1995, USA, no date, no month.

* cited by examiner

*Primary Examiner*—Vibol Tan
(74) *Attorney, Agent, or Firm*—Mitch Harris, Atty at Law, LLC; Andrew M. Harris; Casimer K. Salys

(57) ABSTRACT

A dynamic logic circuit apparatus and method for reducing leakage power consumption via separate clock and output stage control reduces power consumption of processors and other systems incorporating dynamic circuits. The power control signal may be a delayed version of the logic clock and turns on the output inverter foot device after the dynamic node has had sufficient time to evaluate, providing a fast evaluate time and reducing leakage through the inverter input when the foot device is off. Alternatively, a coarsely timed static power control signal may be used to control the inverter foot devices. The drains of the inverter foot devices can be commonly connected across multiple circuits, reducing the foot device total area.

20 Claims, 3 Drawing Sheets

DYNAMIC LOGIC CIRCUIT APPARATUS AND METHOD FOR REDUCING LEAKAGE POWER CONSUMPTION VIA SEPARATE CLOCK AND OUTPUT STAGE CONTROL

This invention was made with Government support under NBCH30390004, BGR W0132280 awarded by PERCS II. THE GOVERNMENT HAS CERTAIN RIGHTS IN THIS INVENTION.

CROSS-REFERENCE TO RELATED APPLICATIONS

This application is related to co-pending U.S. patent application Ser. No. 10/992,486, filed concurrently with this application and entitled "DYNAMIC LOGIC CIRCUIT INCORPORATING REDUCED LEAKAGE STATE-RETAINING DEVICES", by the same inventors and assigned to the same assignee. The specification of the above-referenced application is hereby incorporated by reference. This application is also related to U.S. patent application Ser. No. 10/965,106 filed on Oct. 14, 2004, now U.S. Pat. No. 7,088,141 and entitled "MULTI-THRESHOLD COMPLEMENTARY METAL-OXIDE SEMICONDUCTOR (MTC-MOS) BUS CIRCUIT AND METHOD FOR REDUCING BUS POWER CONSUMPTION VIA PULSED STANDBY SWITCHING", having at least one common inventor and assigned to the same assignee.

BACKGROUND OF THE INVENTION

1. Technical Field

The present invention relates generally to dynamic logic circuits, and more particularly to a dynamic circuit and operating method for reducing power consumption by controlling leakage current.

2. Description of the Related Art

Dynamic logic circuits are an attractive alternative to static logic circuits, as the number of transistors required to implement a given logic function is typically reduced, particularly when providing complex logical implementations as are be found in processor functional blocks such as arithmetic units and other blocks requiring outputs derived from a large number of inputs.

As the operating voltage of dynamic circuits is decreased, an increasing portion of the power consumption of such circuits is now determined by leakage in and through the output stages of the individual logic circuits. A large portion of the leakage is generated at the inputs of the output inverters of each dynamic gate. Leakage occurs from the internal evaluation node of the dynamic circuit through the gate of the transistor in the output stage that is coupled to the power-supply rail opposite the value of the evaluation node. The largest portion of that leakage is associated with the precharge state of the evaluation node and therefore is mostly associated with the particular inverter transistor that conducts when the gate is in the precharge state. For example, if the precharge value is the high (positive) voltage logic state, the typical N-channel device used to drive the logic low state in the typical output inverter is conducting. Gate tunneling causes some leakage current to occur through the N-channel device to the low voltage power supply rail.

While it is possible to supply foot devices throughout the dynamic circuit for power control, doing so disables all of the outputs of the individual gates, causing the dynamic circuit to be in a non-functional power-saving mode. Typically, this is accomplished by turning off the dynamic logic clock to completely disable the dynamic circuit. As such, only a very "coarse" control of leakage power consumption can be achieved, as outputs feeding a next logic stage are invalidated and if the evaluation node is also isolated by a disabled footer, the state held at that node is likewise invalidated.

Therefore, it would be desirable to provide a dynamic circuit architecture such that a finer interval may be used to enter and exit power-savings mode so that power consumption due to leakage can be reduced. It would further be desirable to provide a control mechanism such that the standby mode can be controlled on-the fly, without causing a loss of state information or invalid logic combinations at subsequent stage inputs.

SUMMARY OF THE INVENTION

The objectives of reducing dynamic circuit leakage power consumption by reducing the power-savings control interval and providing a control mechanism for on-the-fly control of power-savings mode are accomplished in a method and apparatus.

The apparatus is a dynamic logic circuit and the method is a method of operation of the dynamic logic circuit that reduce leakage power consumption via separate clock and output stage control of the dynamic circuit. A power control signal turns on the output inverter foot device after the dynamic node has had sufficient time to evaluate, providing a fast evaluate time and reducing leakage through the inverter input when the foot device is off. The foot device is turned on after a predetermined time period has elapsed after the precharge signal is deasserted and then turned off after a second predetermined time period has elapsed after the precharge signal is asserted. Alternatively, a coarsely timed static power control signal may be used to control the inverter foot devices separate from the precharge control. A delay may be used to provide the power control signal, and may be selectively bypassed to remove any maximum frequency penalty associated with the power savings mode. Alternatively, a static power control signal may be used for coarse power savings mode control.

The drains of the inverter foot devices can be commonly connected across multiple circuits, reducing the foot device total area.

A special keeper circuit may be employed to hold a precharge state value at the inverter output when the foot devices are disabled. The keeper circuit uses substantially lower current level than the inverter transistors, providing a low-leakage mechanism for retaining the inverter output state in the low power mode.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
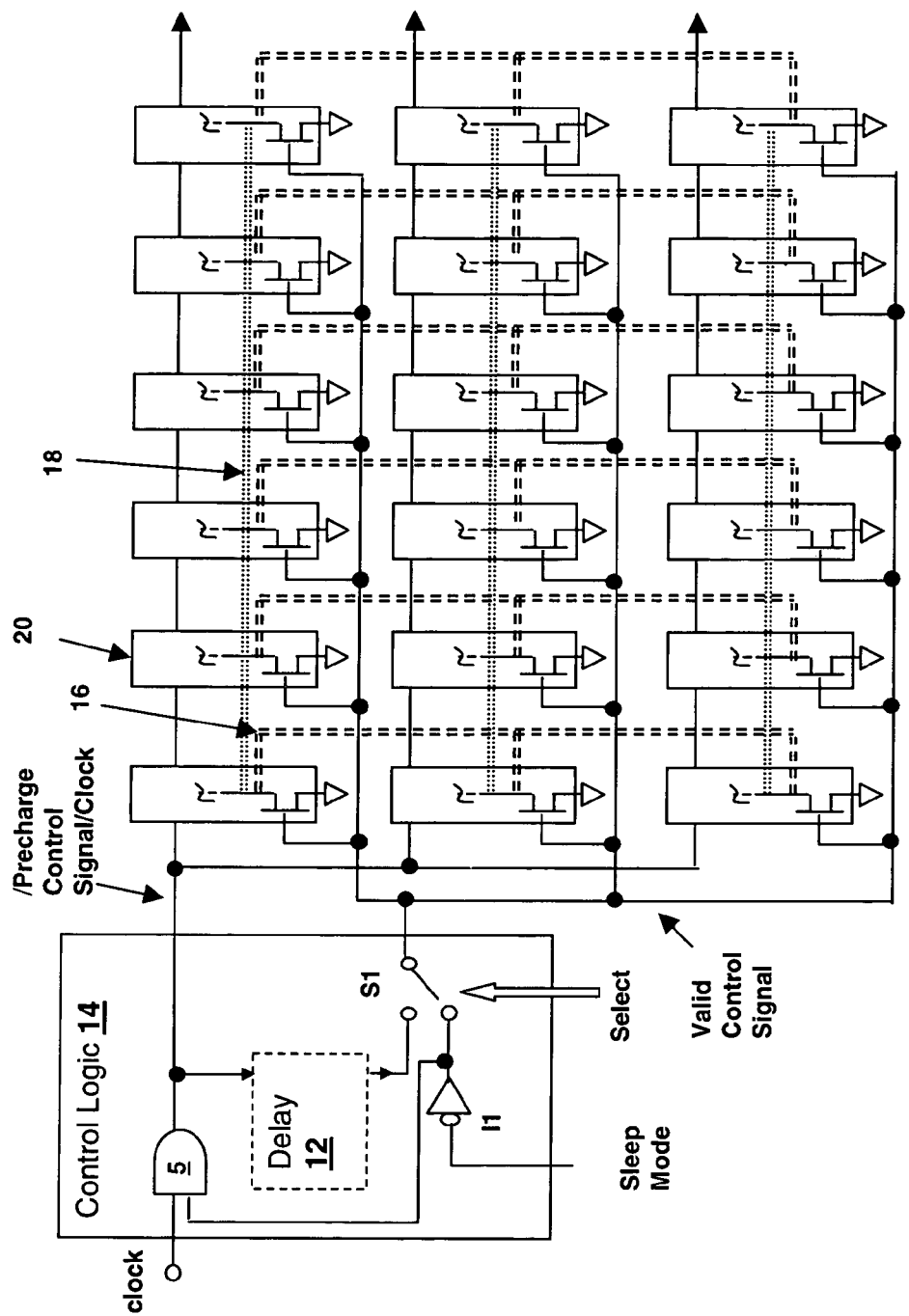
FIG. 1 is a schematic diagram of a circuit illustrating an arrangement of dynamic logic gates in accordance with an embodiment of the invention.

With reference now to the figures, and in particular with reference to FIG. 1, there is depicted a schematic diagram of an arrangement of dynamic logic circuits embodying a method and an apparatus in accordance with the present invention.

Dynamic logic gates 20 are arranged in horizontal rows and vertical columns in the figure, with horizontal rows representing cascaded stages of dynamic logic that provide sequential combinatorial evaluation of outputs of the previous stage along with optional feedback from the same or successive stages. While the illustration does not show the logical inputs and outputs of dynamic logic gates 20, it should be understood that such connections are employed. For example, an accumulator may provide an exclusive-OR implementing a full adder summing the stage inputs with the stages outputs, a multiplier-accumulator may employ a shift function (vertical) in conjunction with an adder, et cetera.

Each of dynamic logic gates 20 receives two control signals: a /precharge signal for controlling the state of the evaluation node prior to evaluation, and a separate power control signal (valid) that controls a foot device in the output stage of each gate to reduce leakage current through the output stage. The valid control signal can provide either fine or coarse control of the foot devices to reduce leakage power consumption, in accordance with alternative embodiments of the invention. A control logic 14 provides the /precharge and valid control signals to dynamic logic gates 20 and is illustrative of several options for implementing the leakage power control of the present invention, including a selectable power control illustrated via switch S1, which in practice could be a hard-wired or register based selection of power control modes.

A logical AND gate 5 qualifies a logic clock signal in conformity with an inversion of a sleep mode signal provided via an inverter I1 so that clocking of the evaluation nodes is halted when the dynamic logic circuit is not being operated. Disabling the /precharge signal for power control is performed by placing the /precharge in the logical low state, readying the evaluation nodes of dynamic logic gates 20 for evaluation by pre-charging them and disabling the footers of the logic trees within dynamic logic gates 20, preventing leakage from the evaluation nodes and through the gate inputs.

In an embodiment corresponding to the middle position of switch S1, the valid control signal can be provided via a delay circuit 12 that provides a delayed version of the /precharge signal. By delaying the /precharge signal to enable the foot device of the output inverters, if an evaluation occurs in a gate during the dynamic gate evaluation period, the pull-up device in the inverter has an improved transition to the logical high state, as the foot device disables the pull-down path corresponding to the logical low state. After the evaluation has occurred, the first predetermined time period (delay period) elapses and the foot device is turned on, so that if an evaluation did not occur, the output is validly held in a logical low state with a strong pull-down for driving subsequent logic inputs. The valid signal is also maintained for a second predetermined time period (which may be equal to the first predetermined time period, e.g., the delay period) after the /precharge signal is asserted (pre-charge state) so that the output inverters of any gates that did evaluate have a fast transition to the pre-charge (logical low) output state.

Thus, the above control scheme provides reduced leakage loss in the output inverters of dynamic logic gates 20 during all times except the time that the valid control signal is asserted, which substantially reduces loss due to leakage in the output inverter pull-down devices and specifically through the gate of the output inverter pull-down devices.

In the bottom position of switch S1, another embodiment of the invention is illustrated. The valid control signal in this selected position or static hard-wired embodiment is a coarsely controlled power mode control signal that disables the foot devices of the inverters in a "sleep" or low power mode. Distinguishing the illustrated embodiment from the prior art technique of disabling an entire gate with a single control signal is the separation of the control of the inverter foot device from the /precharge signal that controls any foot device in the input logic trees. Since the valid control is static and is provided separately from the /precharge signal to each gate, common connections of the virtual supply nodes 16 and/or 18 can be made to provide for the smallest possible inverter foot device area, as all foot devices are on during assertion of the valid signal once the valid signal has propagated to all of gates 20. Further, such connection reduces the loading and thus the drive requirements for the /precharge signal. In the above-described embodiment, it should be noted that the sleep mode signal must be glitch-free and therefore should be derived synchronously with the clock signal, so that no errors are introduced when leaving the low power or "sleep" mode. In essence, the sleep mode signal is timed with the same characteristics as for the "delay embodiment" disclosed above, that is, the sleep mode signal is de-asserted a predetermined time period after the /precharge signal is de-asserted, and reasserted a second predetermined time period after the /precharge signal is again asserted.

As mentioned briefly above, another feature of the present invention that may be applied in conjunction with a coarse granularity sleep mode signal provides for connecting the drain nodes of the output inverter foot devices via vertical connections 16 and/or horizontal connections 18. The connection of these "virtual supply rails" provided by the foot devices permits reduction in the transistor area required to implement the foot devices. Although separate foot devices will generally be used for each gate (in order to reduce inductive effects between gates), the size of the foot devices can be made proportionately smaller due to the increased capacitance of the virtual supply node and the presence of the other foot devices. In general, not every gate 20 will be conducting through the foot device at all times, especially in a domino configuration with cascaded stages, so the impact of the total number of inverters switching to the logical low state will be far below the amount of current that could be conducted if each inverter transitioned to a logical low state simultaneously (which dictates the inverter footer area required when the virtual supply rails are not shared).

The topmost position of switch S1 corresponds to a prior art configuration where all foot devices in dynamic logic gates 20 are driven by the /precharge signal, which may be disabled by the low power mode signal. In general, such power control is only employed in circuits that have static latches interposed between dynamic gates, as the state of the dynamic gate output is affected by deactivating the footer device, affecting the setup of values to be clocked into a next stage. However, embodiments of the present invention include keeper circuits, described in further detail below, that can be used to retain the state information at the output of each gate, making it possible to selectively return to a non-power savings mode operation or one selected only via disabling the clock signal. Such selectivity is useful when a range of operating frequencies may be employed, as an alternative to adjusting or selecting the predetermined delay times associated with delay 12. By selecting the topmost position of S1, any maximum or minimum frequency constraints associated with using delay 12 to derive the valid signal can be selectively removed by disabling the independence of the valid signal and driving the inverter foot devices with the /precharge signal.

Figure 2:
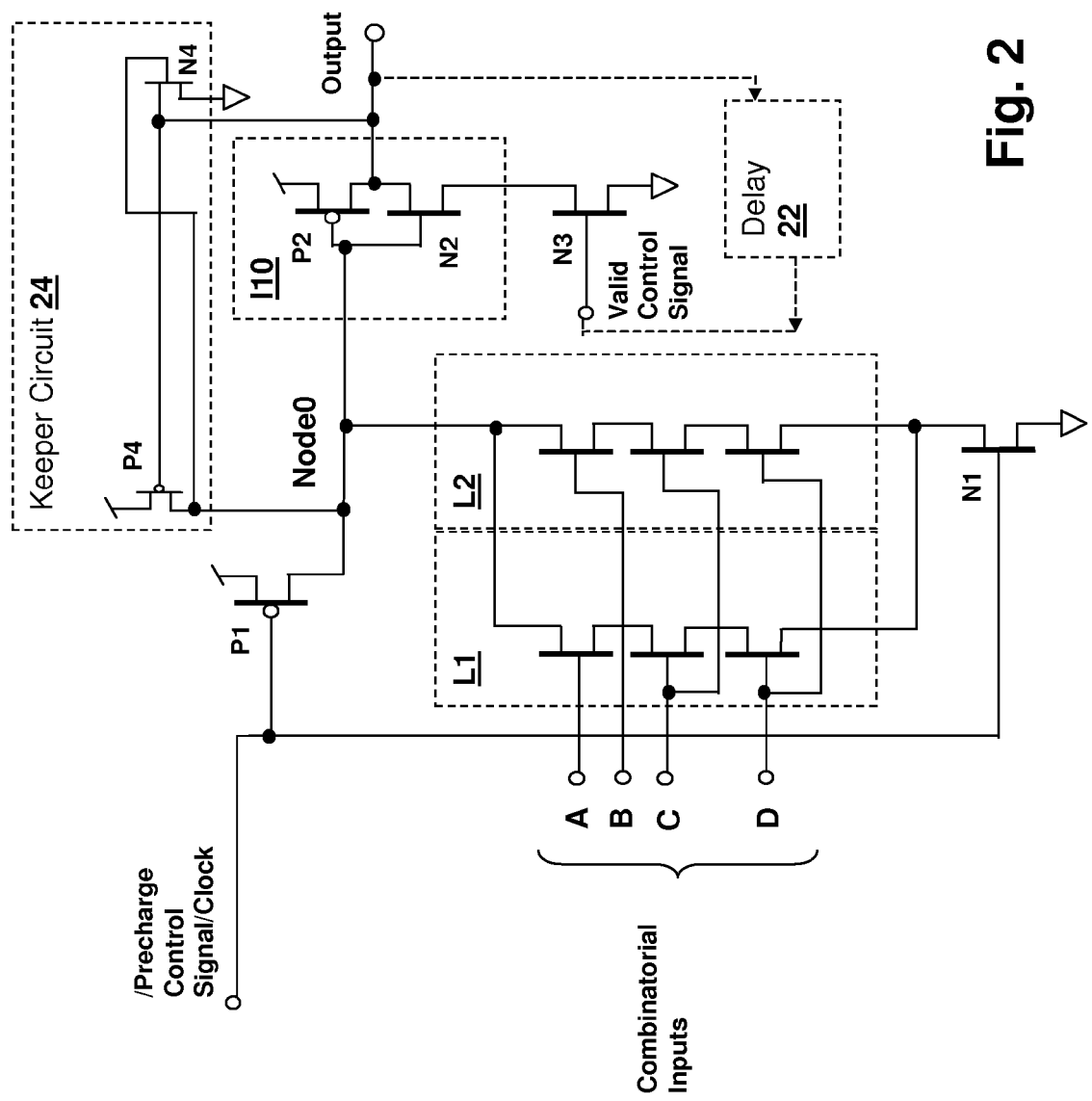
FIG. 2 is a schematic diagram of a dynamic logic gate as used in the circuit of FIG. 1.

Referring now to FIG. 2, a schematic diagram of dynamic logic gates 20 is shown. A dynamic portion of the logical control element is provided by ladders L1 and L2 coupled between a summing node Node0 and ground. Ladders L1 and L2 thus form an N-tree or "tree" of N-channel transistors and if either ladder L1 and L2 is activated during the evaluation phase of the dynamic portion of the control element, summing node Node0 will be pulled low. A foot transistor N1 prevents shorting and/or discharging Node0 during the precharge phase of the dynamic portion of the control element and a precharge transistor P1 precharges node Node0 to a high level. It should be understood that an equivalent structure could be made with P-channel transistors in place of N-channel transistors and vice-versa as long as the power supply rail polarities and signal polarities are reversed. It should be noted that not all dynamic logic trees are made of independent ladders, for example, the transistors receiving input signals C and D could be merged and thus the current paths also merged, forming a more complex tree.

The illustrated N-tree evaluates the equation A·C·D+ B·C·D, where "+" is the logical-OR operator and "·" is the logical-AND operator. However, any combinatorial equation could be implemented by changing the N-tree and the invention encompasses all such logic. An inverter I10 has an input connected to summing node Node0 and provides the output of the control logic element.

Thus, the action of transistors P2 and N2, inverter I10 and ladders L1 and L2 provide the functionality and structure of a dynamic logic gate as wellknown in the art. However, in the depicted embodiment, inverter I10 includes a foot device N3 controlled by the valid control signal as described above. When foot device N3 is turned off, leakage through the gate of transistor N2 when Node 0 is in a logical high state is prevented, reducing power consumption of the circuit. Further, a keeper circuit 24 is included that provides stability of the pre-charge state when the valid signal is deasserted. Transistor N4 is effectively connected in parallel with transistor N2 but is sized substantially smaller than transistor N2, as indicated by the thinner line in the Figure used to show the channel of transistor N4. When the output of dynamic logic gate 20 is falling (valid signal is asserted at this time), transistors N2 and N4 both conduct, providing a fast pulldown of the output of dynamic logic gate 20. After the valid signal is deasserted, only transistor N4 is conducting to hold the logical low output state. Additionally, transistor P4 holds the precharge state on evaluation node Node 0 when the /precharge signal is not asserted, and similarly is sized substantially smaller than pre-charge transistor P1, as indicated by the thinner line used to show the channel of transistor P4. Thus, if the output of dynamic logic gate is in the logical low state (precharge state) and the /precharge signal is not asserted (i.e., the /precharge signal is in the logical high state), then transistor P4 will hold Node 0 high, so that leakage through logic trees L1, L2 and transistor N2 does not cause the precharge value to change until an evaluate occurs due to on-state conduction of logic trees L1 and/or L2.

An alternative embodiment of the circuit of FIG. 2 is also depicted, wherein the valid control signal is provided locally through an independent delay circuit 22. If the valid signal is generated locally, then the valid signal connections of FIG. 1 do not apply, yet an independent precharge clock and valid signaling scheme is nonetheless provided by use of the alternative logic gate circuit. Delay circuit 22 provides a delayed version of the dynamic logic gate output circuit that is used to control the inverter foot device N3 and has an advantage in that foot device N3 is only enabled when the output of the dynamic logic gate has evaluated and only in the interval prior to the next /precharge signal assertion. The above-described self-clocked operation effectively reduces leakage by a factor as great or greater than that of the embodiments described with respect to FIG. 1, as no a priori information indicating whether an evaluate will occur is available to control inverter foot device N3 in the other embodiments. In particular, as the leakage reduction is inversely proportional to the rate at which changes occur in the output of the dynamic gate (i.e., the frequency of "evaluations" to the state opposite the precharge state), if switching is infrequent, the self-clocked embodiment will reduce leakage to a substantially greater factor than the delay 12 clocked embodiment described with respect to FIG. 1.

However, because the result of an evaluation must propagate to the output of the logic gate and through delay 22 prior to enabling inverter foot device N3, the maximum operating frequency of the alternative logic gate circuit is limited over that where the valid signal is externally supplied. In particular, process limitations set the minimum delay available to implement delay 22, providing a potential constraint on the maximum operating frequency of the dynamic circuit.

Figure 3:
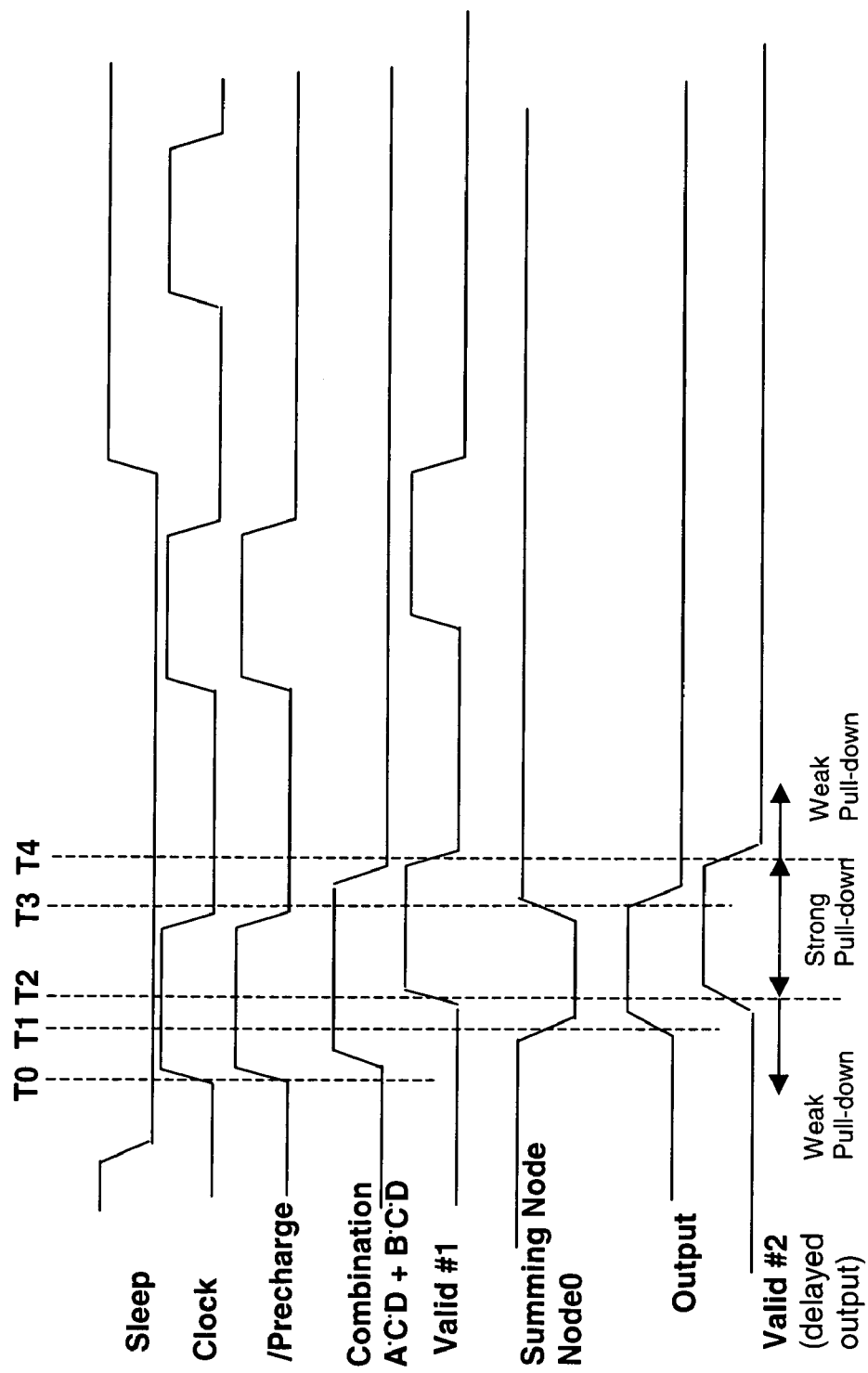
FIG. 3 is a timing diagram depicting signals within the circuit of FIG. 1.

Referring now to FIG. 3, a timing diagram illustrating the operation of the dynamic circuit of FIG. 1 is depicted with a globally clocked valid (#1) and additionally the operation of a logic gate having a self-clocked valid (#2) control signal. Three clock signal periods are used to illustrate three operating conditions. In the first period, the particular combination of logic signals, (A+B)·C·D=1 in the illustration, occurs while low power mode is not asserted, causing an evaluate to occur.

Prior to time T0, Node 0 is pre-charged, inverter foot device N3 is off and keeper transistor N4 is on, weakly holding the Output signal in the logical low state and reducing leakage in the dynamic logic circuit. At time T0, /Precharge is deasserted while valid #1 remains low for a predetermined period of time. At time T1, Node 0 transitions to a logic low state due to evaluation and the Output signal transitions to a logical high state rapidly due to the weak pull-down provided by transistor N4. At time T2, the valid #1 signal is asserted, providing a strong pull-down between times T2 and T3, which is the interval for sampling the Output signal into subsequent stages. At time T3, the /precharge signal is asserted, and the valid #1 signal remains asserted, providing a strong pull-down via transistor N4 and foot device N3 so that a rapid transition to a logical low state is achieved in the Output signal. At time T4, the second predetermined time period elapses and the valid signal is de-asserted, turning off foot device N3, thereby reducing leakage and readying the gate for the next evaluate period while the weak pull-down of N4 is employed.

The second clock period depicted is a period in which no evaluate occurs and the sleep signal is not asserted. The third clock period illustrates that when sleep is asserted, neither the /precharge, nor the valid signal is asserted.

The valid #2 signal is provided to illustrate that in the "self-clocked inverter footer" embodiment of the dynamic logic gate (the embodiment incorporating delay 22 of FIG. 2), the valid signal is only asserted after an evaluate has occurred. I While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A dynamic logic circuit comprising:
   a dynamic logic tree formed from one or more transistors coupled between a summing node and a first power supply rail corresponding to a first logical state, and wherein gates of said transistors are coupled to one or more logical input signals;
   a precharge circuit connected to said summing node and a second power supply rail for setting said summing node to a precharge voltage level corresponding to a second logical state opposite from said first logical state, said precharge circuit having an input coupled to a precharge clock signal, whereby said summing node is held in said second logical state while said precharge clock signal is asserted;
   an inverter having an input coupled to said summing node and an inverter output providing an output signal of said dynamic logic circuit;
   an inverter foot device coupled between said first power supply rail and a power supply rail of said inverter, whereby conduction through said inverter to said first power supply rail is disabled in response to assertion of a power control signal coupled to an input of said inverter foot device; and
   a control logic for providing said power control signal and said precharge clock signal, wherein said power control signal is deasserted a predetermined time after deassertion of said precharge clock signal and asserted a second predetermined time after said assertion of said precharge clock signal, whereby current leakage into said inverter is reduced when said power control signal is asserted.

2. The dynamic logic circuit of claim 1, wherein said control logic further comprises a delay having an input coupled to said precharge clock signal and an output providing said power control signal, whereby said first and second predetermined times are generated as substantially equal delays.

3. The dynamic logic circuit of claim 1, wherein said control logic further comprises an AND gate having a first input coupled to a clock signal, a second input coupled to said power control signal and an output providing said precharge clock signal, whereby said precharge clock signal is disabled when said power control signal is deasserted.

4. The dynamic logic circuit of claim 1, wherein said power control signal is a coarse power control signal that is asserted for multiple cycles of said precharge clock signal.

5. The dynamic logic circuit of claim 4, wherein said control logic further comprises a selector for selecting between a sleep signal that is asserted for multiple cycles of said precharge clock signal and the output of a delay having an input coupled to said precharge clock signal.

6. The dynamic logic circuit of claim 1, wherein said logic gate further comprises a keeper circuit connected to said inverter output and said summing node for holding said output at a voltage indicating said first logical state when said inverter foot device is disabled.

7. The dynamic logic circuit of claim 6, wherein said keeper circuit is a transistor having a gate connected to said summing node, a first channel connection connected to said first power supply rail and a second channel connection connected to said inverter output, said transistor having an area substantially smaller than devices within said inverter.

8. The dynamic logic circuit of claim 7, wherein said keeper circuit further comprises a second transistor having a gate connected to said inverter output, a first channel connection connected to said second power supply rail and a second channel connection connected to said summing node for holding said summing node at said precharge voltage level when said precharge clock signal is deasserted and said dynamic logic tree is in a nonconducting state.

9. A dynamic logic circuit comprising:
   a plurality of dynamic logic gates, each including an inverter providing an output from a dynamic evaluation node connected to at least one logic tree for receiving one or more logic inputs and discharging said evaluation node in response to a logical combination, a precharge circuit for charging said evaluation node in response to a precharge clock signal, and an inverter having an input coupled to said dynamic evaluation node and an inverter output providing an output signal of each dynamic logic gate, and wherein said dynamic logic gates further include an inverter foot device coupled between a first power supply rail and a power supply rail of said inverter, whereby conduction through said inverter to said power supply rail is disabled in response to assertion of a power control signal coupled to an input of said inverter foot device; and
   a control logic for providing said power control signal and said precharge clock signal, wherein said power control signal is deasserted a predetermined time after deassertion of said precharge clock signal and asserted a second predetermined time after said assertion of said precharge clock signal, whereby current leakage into said inverter is reduced when said power control signal is asserted.

10. The dynamic logic circuit of claim 9, wherein said power control signal is a coarse power control signal that is asserted for multiple cycles of said precharge clock signal.

11. The dynamic logic circuit of claim 10, wherein said plurality of dynamic logic gates are arranged as a series of cascaded gates, and wherein said connection between said power supply rail of said inverter and said inverter foot device is commonly connected for said series of cascaded gates.

12. The dynamic logic circuit of claim 10, wherein said plurality of dynamic logic gates are arranged parallel simultaneously clocked gates, and wherein said connection between said power supply rail of said inverter and said inverter foot device is commonly connected for said parallel gates.

13. The dynamic logic circuit of claim 10, wherein said plurality of dynamic logic gates comprise multiple sets of parallel simultaneously clocked gates, each set arranged as a series of cascaded gates, and wherein said connection between said power supply rail of said inverter and said inverter foot device is commonly connected for all of said plurality of dynamic logic gates.

14. The dynamic logic circuit of claim 9, wherein said control logic further comprises a delay having an input coupled to said precharge clock signal and an output providing said power control signal, whereby said first and second predetermined times are generated as substantially equal delays.

15. The dynamic logic circuit of claim 9, wherein said control logic further comprises an AND gate having a first input coupled to a clock signal, a second input coupled to said power control signal and an output providing said precharge clock signal, whereby said precharge clock signal is disabled when said power control signal is deasserted.

16. A method of operating a dynamic circuit, comprising:
generating a precharge clock signal for precharging one more more summing nodes of one or more gates of said dynamic circuit;
second generating a power control signal separate from said precharge clock signal for controlling one or more footer devices isolating inverters of said one or more gates from a power supply rail, said inverters having inputs connected to associated ones of said summing nodes and outputs providing outputs of said one or more gates.

17. The method of claim 16, wherein said second generating is performed by delaying said precharge clock signal.

18. The method of claim 16, wherein said second generating generates a power control signal that is active for multiples cycles of said precharge clock signal.

19. The method of claim 16, further comprising providing keeper devices connected between said outputs of said gates and said power supply rail, said keeper devices having an area substantially smaller than devices of said inverters.

20. The method of claim 16, wherein said one or more gates comprises a plurality of gates and further comprising commonly connecting connections between said foot devices and said inverters for at least two of plurality of gates.

* * * * *